United States Patent [19]

Ishihara et al.

[11] 4,329,699
[45] May 11, 1982

[54] SEMICONDUCTOR DEVICE AND METHOD OF MANUFACTURING THE SAME

[75] Inventors: Shin-ichiro Ishihara, Moriguchi; Koshiro Mori, Osaka; Tsuneo Tanaka, Nishinomiya; Seiichi Nagata, Sakai; Masakazu Fukai, Nishinomiya, all of Japan

[73] Assignee: Matsushita Electric Industrial Co., Ltd., Osaka, Japan

[21] Appl. No.: 132,406

[22] Filed: Mar. 21, 1980

[30] Foreign Application Priority Data

Mar. 26, 1979 [JP] Japan .................................. 54-35872
Mar. 26, 1979 [JP] Japan .................................. 54-35873
Sep. 10, 1979 [JP] Japan ................................ 54-115906

[51] Int. Cl.³ .......................................... H01L 45/00
[52] U.S. Cl. ........................................ 357/2; 357/16; 357/61; 357/30
[58] Field of Search ......................... 357/2, 61, 16, 30

[56] References Cited

U.S. PATENT DOCUMENTS 3,716,844  2/1973  Brodsky .............................. 357/2 X
4,109,271  8/1978  Pankove ........................... 357/16 X Primary Examiner—Martin H. Edlow
Attorney, Agent, or Firm—Stevens, Davis, Miller & Mosher

[57] ABSTRACT

A semiconductor device utilizing amorphous $Si_{1-x}C_x(0 \leq X \leq 1)$ containing hydrogen. Through a high frequency glow discharge process or a high frequency sputtering process, the composition x is varied to form a heterojunction between amorphous $Si_{1-x}C_x$ layers, and electrodes are mounted to the layers to complete the device. The amorphous material is desirably selected to have a forbidden band width of 1.7 to 3.2 eV so that the sensitivity of the device can cover the visible range. Because of the amorphous layers, freedom of type and shape of the substrate of the device is large. The dark resistance of the layers is large to improve the photoconductive characteristics of the semiconductor device.

4 Claims, 16 Drawing Figures

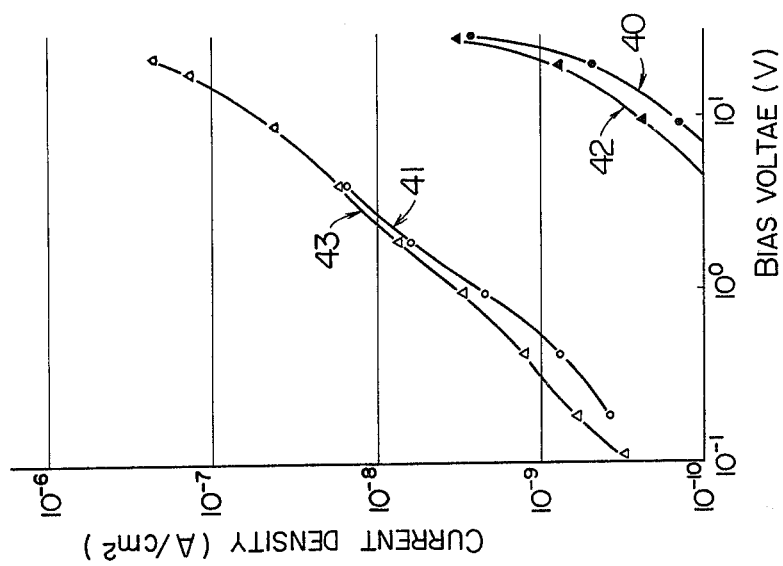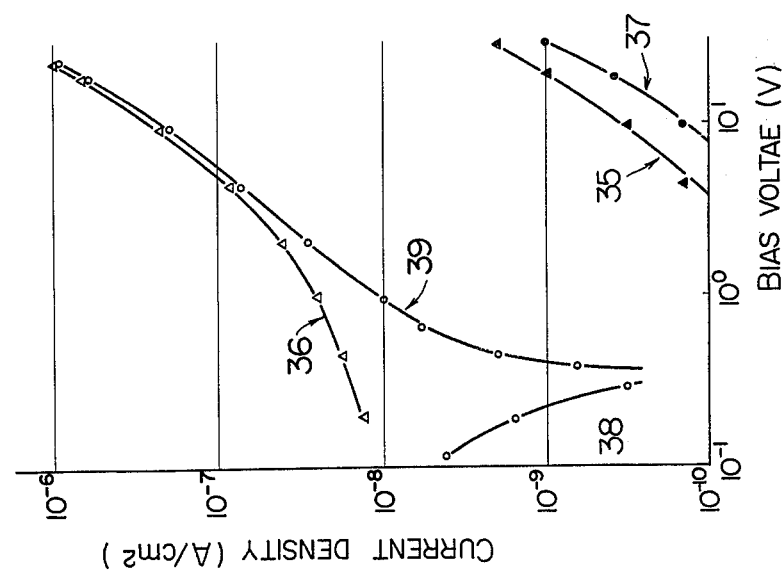

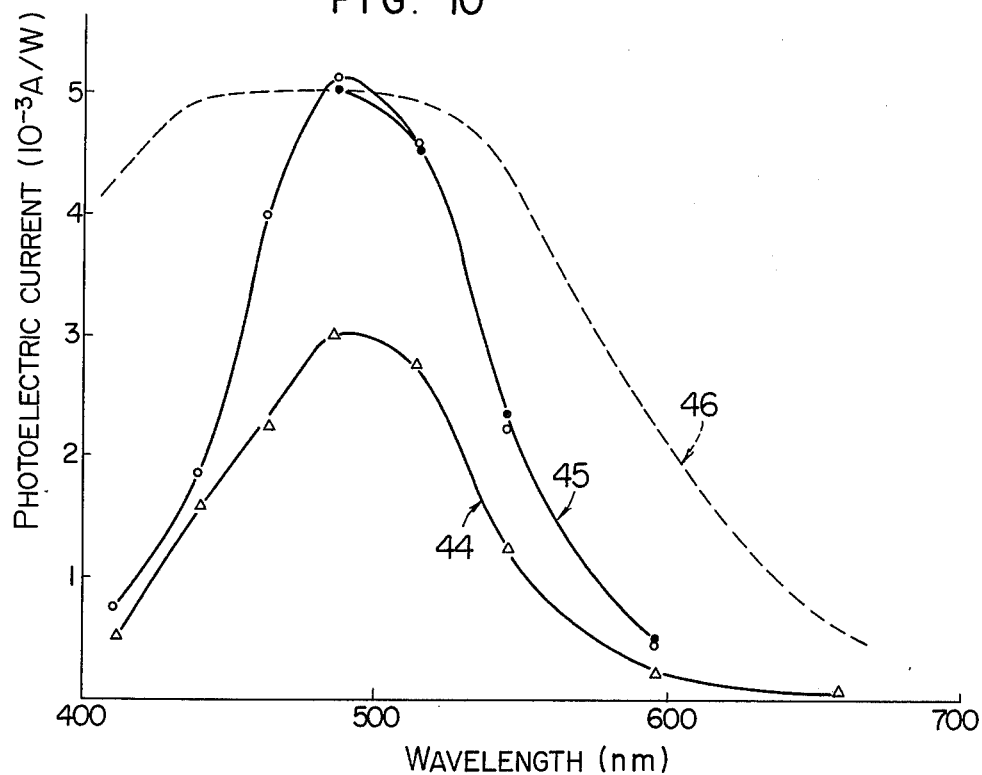
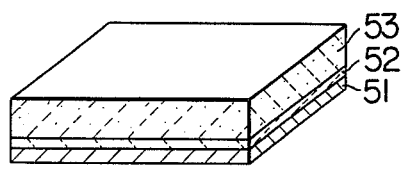
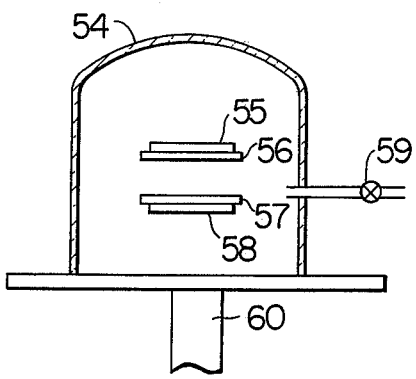
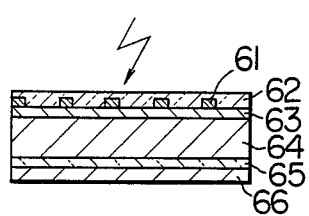

SEMICONDUCTOR DEVICE AND METHOD OF MANUFACTURING THE SAME

BACKGROUND OF THE INVENTION

This invention relates to semiconductor devices with photoconductivity and more particularly to a semiconductor device having high photoconductivity for visible rays.

Selenium (Se) and cadmium sulphide (CdS) have hitherto been known as materials having high photoconductivity and so high a dark resistance that they can be applied with high electric field. However, these materials are poisonous and classified into a material source of environmental pollution and the advent of a semiconductor device using a substitutive, unpolluted material has long been desired.

Recently, amorphous silicon has been highlighted as a material which is unpolluted and yet has high photoconductivity. This material is, however, disadvantageous in that the resistivity at room temperature is of the order of $10^{13}$ Ψ.cm at the most, that a breakdown voltage in current-voltage characteristics is so low that a high voltage or a high electric field cannot be applied, and that the dark current density is large.

Also, Phil. Mag. page 7, Vol 35, 1978, suggests availability of amorphous silicon carbide, a-$Si_{1-x}C_x$, as an unpolluted material and discloses a preparation process thereof. It further teaches that as the concentration of carbon to be mixed with amorphous silicon is increased, the energy gap is increased before the carbon concentration reaches a certain limit so that the resistivity at room temperature can be increased. However, photoconductivity of this material has not yet been discussed in any papers.

Conventionally, it has been known to independently prepare either amorphous silicon film or amorphous silicon carbide film by sputtering or through plasma glow process. In one method, for example, a target silicon substrate is sputtered to deposit silicon on the other substrate, thereby forming an amorphous silicon film. In the other method, a silicon substrate carrying a lamp of carbon is sputtered to deposite silicon carbide by the reaction of sputtered carbon and silicon on the other substrate. However, to fabricate a device having a heterojunction between silicon and silicon carbide, the above known method requires an additional preparation step and it also has difficulties with varying the amount of each component in silicon carbide.

SUMMARY OF THE INVENTION

The inventors of this invention have carefully studied characteristics of a-$Si_{1-x}C_x$ to find that this material has a high resistivity at room temperature, excellent photoconductivity, and ability to transport charges injected into it. The present invention is based on this fact. Further, according to this invention, there is provided an excellent photoconductive semiconductor device which comprises a heterojunction formed between a first layer of a relatively small x composition and a second layer of a relatively large x composition so that the first layer can exhibit broad light wavelength sensitivity and the second layer can exhibit a high breakdown voltage.

An object of this invention is to provide a semiconductor device using an unpolluted material having high photoconductivity for visible rays, high breakdown voltage and small dark current.

Another object of this invention is to provide a semiconductor device having excellent functions for photoconduction and photoelectromotive force.

Still another object of this invention is to provide a semiconductor device having high mechanical strength and being suitably applicable to, for example, a photosensitive layer for use in electrophotography.

BRIEF DESCRIPTION OF THE DRAWINGS

FIG. 1b is a longitudinal sectional view of the device shown in FIG. 1a.

FIG. 8 is a graph to show a relation between an applied voltage and a dark current as well as a photo-current in one example of semiconductor device according to the present invention.

FIG. 9 is a similar graph in another example of semiconductor device according to the present invention.

FIG. 10 is a graph to show a relation between a photoelectric current and wavelength of incident light in one example.

FIG. 11 is a perspective view to show a heterojunction device embodying the present invention.

FIG. 12 is a diagrammatic representation of an apparatus used for fabricating the device shown in FIG. 11.

FIG. 13 is a longitudinal sectional view of another heterojunction device embodying the present invention.

DESCRIPTION OF THE PREFERRED EMBODIMENTS

In the present invention, the photoconductive device utilizes a-$Si_{1-x}C_x$ containing hydrogen.

The invention will now be described by way of examples with reference to the accompanying drawings.

Figure 1A:
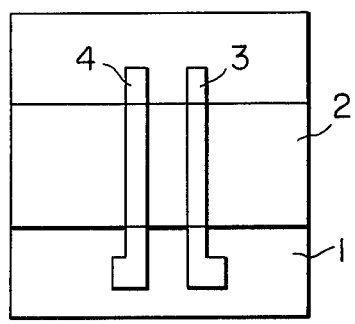
FIG. 1a is a plan view to show the fundamental construction of a trial photoconductive semiconductor device for achieving the present invention.
Figure 1B:
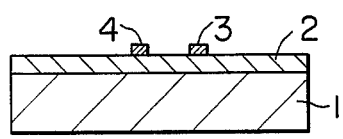

Referring to FIGS. 1a and 1b, an electric field which is parallel to the surface of a photoconductive layer is applied to a photoconductive device for achieving the invention. In another trial as shown in FIG. 2, electric field is applied perpendicularly to the surface of a photoconductive layer.

The device as shown in FIGS. 1a and 1b comprises a substrate 1, an a-SiC photoconductive layer 2, and electrodes 3 and 4 across which voltage is applied.

The substrate 1 is preferably made of a good insulator material such as quartz glass or ceramics. The electrodes 3 and 4 are preferably made of a material which makes substantial ohmic contact with the photoconductive layer 2, such as a suitable metallic material or transparent conductive material including metal oxide. The photoconductive layer 2 comprises, according to the invention, an a-SiC layer containing hydrogen, the resistivity of which can be controlled by doping impurities. When high breakdown field or voltage is required of a photoconductive device, this device desirably has a resistivity at room temperature of more than $10^{14}$ $\Omega$.cm and an $Si_{1-x}C_x$ layer wherein x is larger than approximately 0.2. On the other hand, when high breakdown field or voltage is not required, an a-SiC layer with a desired carbon composition may be used. The concentration of hydrogen to be contained in the a-SiC is so determined as to compensate for the dangling bond of such compositional elements as carbon and silicon and may typically be of the order of 5 to 40 mol %. As a result of the inventor's study, it was also proven that the resistivity can be controlled by doping the a-SiC with an element of III or V family. Accordingly, the resistance of the a-SiC can be controlled to meet intended applications.

Figure 2:
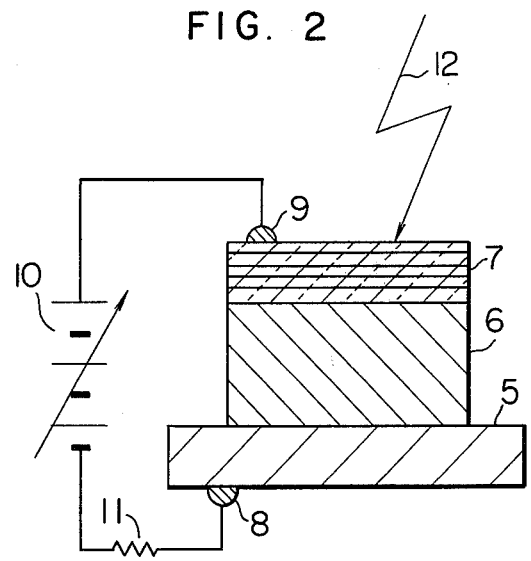
FIG. 2 is a longitudinal sectional view to show the fundamental construction of another trial photoconductive semiconductor device.

The device as shown in FIG. 2 comprises a substrate 5, a photoconductive layer 6 to which the invention is applied, a transparent conductive layer 7, electrodes 8 and 9 for connection with an external circuit, a power supply 10, and a load resistor 11. Reference numeral 12 designates incident light. The substrate 5 and the transparent conductive layer 7 are made of a conductive material and are in ohmic contact with the photoconductive layer 6 or may otherwise be contiguous to the photoconductive layer via Schottky barriers. The photoconductive layer 6 has substantially the same function as the photoconductive layer 2 as shown in FIG. 1, but doped thin layers may be provided at interfaces contiguous to the substrate 5 and the transparent conductive layer 7.

The photoconductive device described above can be fabricated as follows. To prepare the substrate, either a crystalline or a non-crystalline material is used which is durable at deposition temperatures for the photoconductive layer, for example, 150° C. to 600° C., and its surface is flattened and smoothed. Thus, for example, a semiconductor such as Si single crystal, a metal such as stainless steel or aluminum, or a quartz glass with or without a conductive film of metal or metal oxide coated on its surface may be used as the substrate. The surface of the substrate is cleaned, and the substrate is then placed in a glow discharge apparatus and heated to 150° to 600° C. by a suitable heat source. A carrier gas containing a high purity inert gas, for example, argon and an additive of hydrogen is diluted and mixed with such a silicon compound in the form of gas at room temperature as $SiH_4$ and such a carbon compound in the form of gas at room temperature as $C_2H_4$. As the mixture gas is guided to the glow discharge apparatus, it is decomposed by glow discharge so that an a-SiC containing hydrogen is deposited on the substrate. When the deposition of an a-SiC added with impurities is desired, a gaseous compound of an element of III or V family, for example, $B_2H_6$ or $PH_3$ is added with a relative concentration of 10 ppm to 10 Vol.% to the concentration of $SiH_4$ and $C_2H_4$ in the diluted mixture gas. Thereafter, a conductive material is vapor deposited onto the deposition of a-SiC to form an electrode. A transparent conductive material, for example, a metal thin film of Pt or Au, a metal oxide of $In_2O_3$ or $SnO_2$, or a metal film of Al, Au or Sb may selectively be used as the conductive material in accordance with the intended purpose. The electrode may take a form as desired. The fabrication process as described above is an example only and the invention is not in any way limited thereto.

The construction and fabrication process of the photoconductive device according to the invention have been outlined in the foregoing description. Hereunder, the description will be made in more detail by way of examples. The ratio of concentrations of $SiH_4$ and $C_2H_4$ diluted with high purity argon was varied to prepare various mixture gases. The respective mixture gases were decomposed in a glow discharge apparatus and deposited on a transparent quartz glass substrate and an aluminum substrate, respectively, which were maintained at 250° C. to form an a-SiC film of a thickness of 1 to 2 $\mu$m. The a-SiC sample deposited on the aluminum substrate was examined through a 4 KeV electron beam for excited characteristic X-ray intensities. The intensity of a characteristic X-ray shows such a dependency of composition x (of $Si_{1-x}C_x$) in the a-SiC film upon the mixture gas composition as listed in Table 1.

TABLE 1

| Ratio of gas compositions (Remainder being Ar gas) | Evacuated pressure | Width of forbidden band | x in $Si_{1-x}C_x$ |
| --- | --- | --- | --- |
| $SiH_4$ = 0.45 vol. % $C_2H_4$ = 0.9 vol. % | 1 Torr | 2.68 ~ 2.8 eV | about 0.82 |
| $SiH_4$ = 18 vol. % $C_2H_4$ = 18 vol. % | 0.2 Torr | 2.28 ~ 2.35 eV | about 0.36 |
| $SiH_4$ = 20 vol. % | 0.1 Torr | 1.6 ~ 1.7 eV | 0 |

Figure 3:
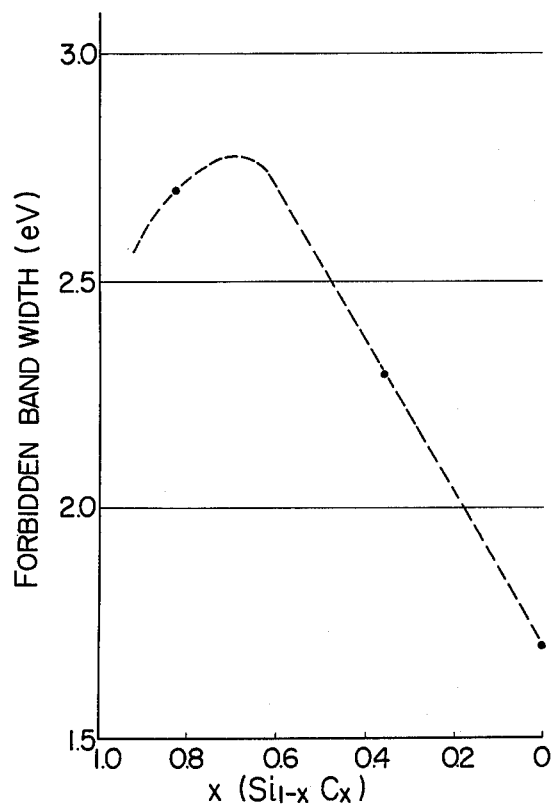
FIG. 3 is a graph to show a relation between composition x in a-$Si_{1-x}C_x$ and energy gap (Eg.)

The spectral transmittivity of the a-SiC deposited on the transparent quartz glass substrate is measured to obtain dependency of $(\alpha\lambda\nu)^{\frac{1}{2}}$ upon $\lambda\nu$ so as to obtain the dependency of energy gap Eg upon the composition. The result is shown in FIG. 3. Aluminum is vapor deposited onto the a-SiC deposited on the transparent quartz substrate through a mask to form parallel electrodes 3 and 4 as shown in FIG. 1, thus completing a photoconductive device.

The thus fabricated photoconductive device is examined in terms of sensitive light wavelength range and dark resistance to find that the sensitive light wavelengths are shorter than Eg (in terms of wavelength) and the dark resistance increases with the increase in Eg. Accordingly, the sensitive light wavelength range of the photoconductive device can desirably be set to cover visible range and ultraviolet range. This means that the device can be utilized as a device whose sensitive light range can freely be designed to meet the intended purposes.

Figure 4:
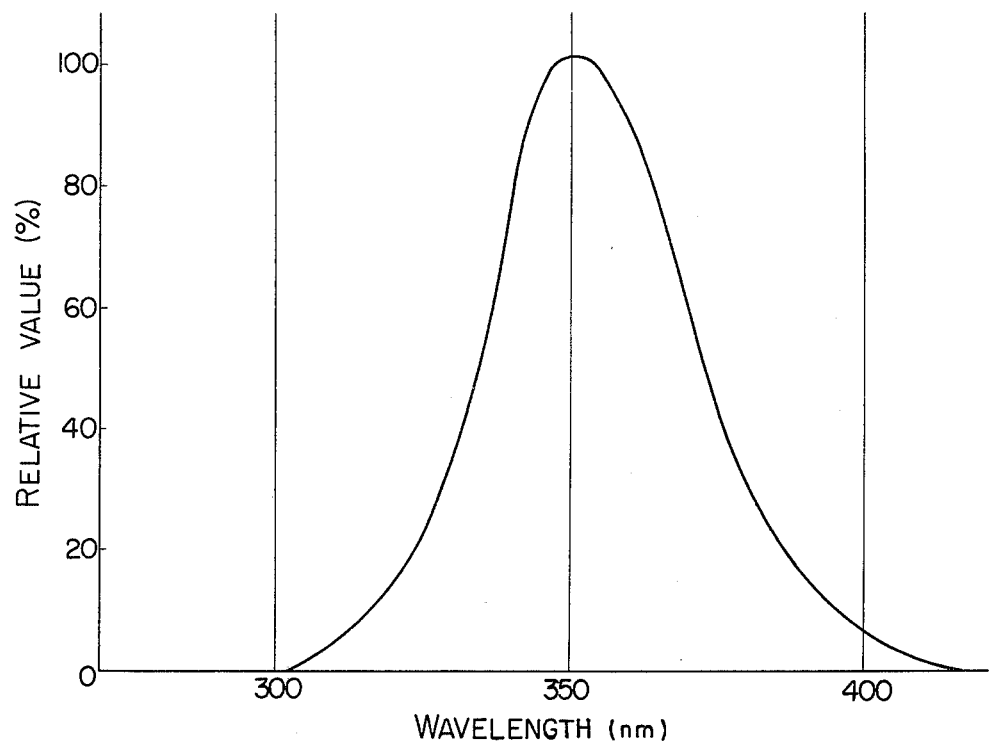
FIG. 4 is a graph to show a luminous spectral curve of a light source used for examining characteristics of the photoconductive semiconductor device shown in FIG. 3.
Figure 5:
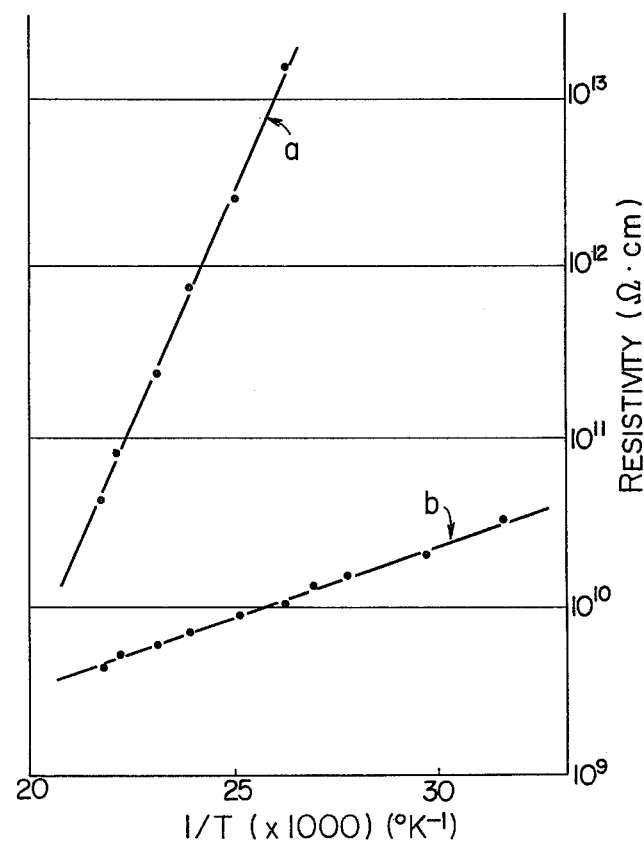
FIG. 5 is a graph to show temperature dependencies of dark resistivity and light resistivity of the device shown in FIG. 3.

With the photoconductive device thus fabricated, even when the carbon concentration in the a-SiC is extremely large, that is, x≈0.8, a typical example which shows high photo-sensitivity can be obtained. In this case, the device has characteristically no photosensitivity in the visible range but it is sensitive to light wavelengths in the ultraviolet range. Light of a luminous spectrum alone as shown in FIG. 4 is irradiated on the device at an intensity of illumination which is converted into a value of about 200 Lx in visible range. Under this condition, the dependencies of dark resistivity and light resistivity upon temperature in the device are measured. A result is shown in FIG. 5, where line a represents dark resistivity and line b light resistivity. When the characteristics shown in FIG. 5 are extrapolated to room temperature, dark resistivity at room temperature will presumably be $10^{16}$ to $10^{17}$ $\Omega$.cm so that it can be presumed that the ratio of dark resistivity to light resistivity will be $10^6$ to $10^7$ at the 200 Lx intensity of illumination, thereby providing a photoconductive device having a high signal to noise ratio.

While in the foregoing discussion the characteristics of a high carbon concentration device have been described, the carbon concentration in the device according to the invention can freely be controlled. And by varying the carbon concentration, the energy gap (Eg) can be varied to permit desirable determination of the sensitive light wavelength and eventually; therefore it is possible to fabricate a device having high sensitivity to a desired wavelength range.

Next, deposited onto a stainless steel substrate with the surface polished is an a-SiC in 2 $\mu$m thickness having the same composition of $x \approx 0.8$ as in the foregoing example. An $In_2O_3$ film is then formed on the a-SiC film to fabricate a photoconductive device as shown in FIG. 2. The device thus fabricated can have a dark current of less than $10^{-10}$ A/cm$^2$ under the application of 20 V voltage or $1 \times 10^5$ V/cm electric field intensity, thus exhibiting extremely high withstandability against the high electric field intensity and, in addition, high photosensitivity.

To compare the device of the invention as exemplified above and the conventional device having a Se or CdS photoconductive film in mechanical strength, both the samples are scratched by the tip of a stainless steel pincette. The result is that the conventional device with the Se or CdS film is readily damaged whereas no appreciable damage occurs in the device of the invention even when it is scratched terribly.

The examples as described above using only amorphous silicon carbide for the photoconductive layer give the base of the present invention. This invention is based on a heterojunction between first and second layers each having different compositions in respect to silicon or carbon, as will be described below.

Figure 6:
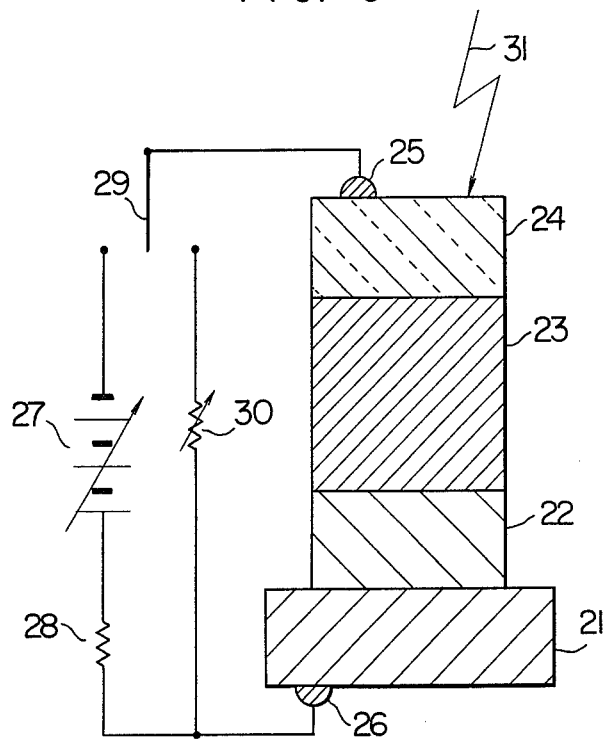
FIG 6 is a schematic diagram to show a fundamental construction of a semiconductor device embodying the present invention.

Referring to FIG. 6, an exemplified fundamental construction of a semiconductor device according to the invention comprises a conductive substrate 21, and layers 22 and 23 of a-Si$_{1-x}$C$_x$ containing hydrogen which are laminated on the substrate 21. In the layers 22 and 23, x is different, forming a heterojunction at the interface between these layers. A transparent conductive film 24 may be made of Pt, Au, $In_2O$ or $SnO_2$. Electrodes 25 and 26 for connection of the device to an external electric circuit are provided on the transparent conductive film 24 and the substrate 21. Between the electrodes 25 and 26 are connected a series connection of a power supply 27 and a load resistor 28 and a variable load resistor 30 through a switch 29. When photoconductivity of the device is used, the switch 29 is transferred to the power supply 27. When photoelectromotive force of the device is utilized, the switch 29 is transferred to the variable load resistor 30. Reference numeral 31 represents incident light.

The first a-Si$_{1-x}$C$_x$ layer 22 is selected to contain a relatively small x and is sensitive to illumination light of visible range to readily create photoexcited charge carriers, whereas the second a-Si$_{1-x}$C$_x$ layer 23 is selected to contain a relatively large x and has a relatively large energy gap (Eg) to transport the charge carriers created by the first layer 22 and injected therefrom, exhibiting high dark resistance and optical transparency. Thus, the heterojunction is formed with the first layer 22 having ability to sense light wavelengths in the visible range and the second layer 23 having the ability to withstand against high electric field and voltage and transport injected charges to ensure that there is provided a semiconductor device which is of photoconductivity and photoelectromotive force and which is of high sensitivity and breakdown voltage. In FIG. 6, the first layer 22 is illustrated as a lower layer and the second layer 23 as an upper layer but this order may be reversed.

Figure 7:
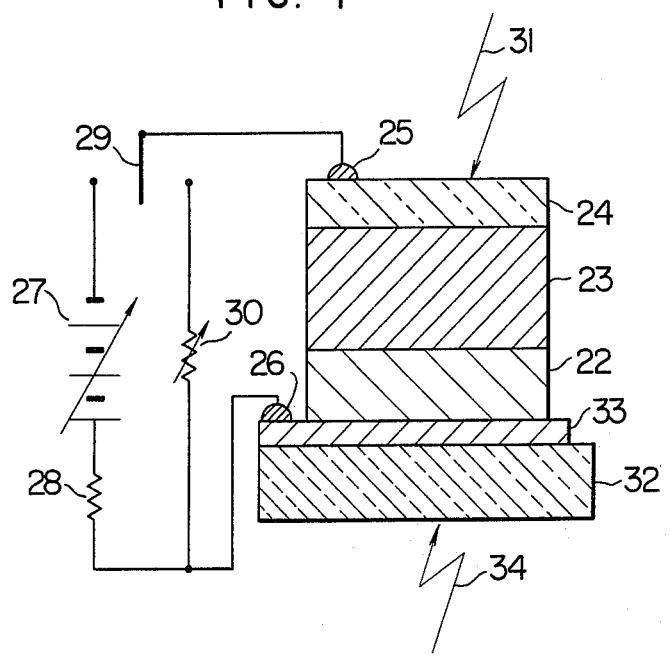
FIG. 7 is a schematic diagram to show a fundamental construction of another semiconductor device embodying the present invention.

Referring to FIG. 7, another exemplified fundamental construction of a semiconductor device of photoconductive function according to the invention will be described. In FIG. 7 like reference numerals designate like parts in FIG. 6. What is different from FIG. 6 resides in that a transparent conductive film 33 is formed on a transparent substrate 32. With this construction as shown in FIG. 7, it is possible to fabricate a semiconductor device which is also sensitive to light 34 incident on the substrate 32.

To sum up, the semiconductor device of the invention is advantageous in that:

(1) It has a high breakdown voltage externally applied and when desired to be designed as a photoconductive device which has high photo-sensitivity, the design consideration is simply such that x in the second layer is made larger than that in the first layer and is made to have a high resistance; and (2) When the device is desired to be designed as a photoelectromotive force device which is activated with external incident light, the design consideration is simply such that the second layer is doped with impurities to lower its resistance and is made thinner than the first layer to decrease absorption of the coming external light within the second layer and to facilitate the transport of the charge carriers excited by photons within the first layer.

The process for fabricating the semiconductor device of the invention will be exemplified hereunder. To prepare the substrate, either a crystalline or a non-crystalline material is used which is durable at deposition temperatures for the photoconductive layer, for example, 150° to 600° C., and its surface is flattened and smoothed. Thus, for example, a semiconductor such as Si single crystal, a metal such as stainless steel or aluminum, or such an insulator as a quartz glass, ceramic or plastic film durable at the above-mentioned temperatures with a conductive film of metal or metal oxide coated on its surface may be used as the substrate. The surface of the substrate is cleaned, and the substrate is then placed in a glow discharge apparatus and heated to a desired temperature. A mixture gas having a first composition ratio in which a silicon compound in the form of stable gas at room temperature such as SiH$_4$ is mixed with a carbon compound in the form of stable gas at room temperature such as C$_2$H$_4$ at a first desired concentration ratio is diluted with an inert gas such as argon. Similarly, a mixture gas having a second composition ratio in which SiH$_4$ is mixed with C$_2$H$_4$ at a second desired concentration ratio is diluted with argon.

As the diluted mixture gases of the first and second composition ratios are successively guided to the glow discharge apparatus, they are successively decomposed by glow discharge at $10^{-2}$ to $10^{-1}$ Torr for a desired time so that layers of a-$Si_{1-x}C_x$ of desired compositions and thickness are successively deposited on the substrate, thereby forming a heterojunction between the two layers.

Obviously, it is possible to form a graded heterojunction by gradually varying the concentration ratio between silicon compound and carbon compound in the material gas upon the formation of the first layer and the subsequent formation of the second layer or the reversed formation process.

In particular, when the deposition of an a-$Si_{1-x}C_x$ doped with impurities is desired, a gaseous compound of an element of III or V family, for example, $B_2H_6$ or $PH_3$ is added to the diluted mixture gas.

Thereafter, a transparent conductive layer is formed by a known technique on the a-$Si_{1-x}C_x$ layer having the heterojunction to complete a semiconductor device of the invention. The fabrication process as described above is an example only and the invention is not limited thereto.

Hereunder, the invention will be described in more detail by way of preferred embodiments.

A Si crystalline (p-type, 10 Ω.cm) substrate, a stainless steel substrate and a quartz glass substrate with an $In_2O_3$:$SnO_2$ (ITO) transparent conductive film coated on it were respectively used. The substrate was placed in a 13.5 MHz high frequency glow discharge apparatus and heated to 250° C. To form the first layer of about 1 μm thickness, argon gas containing 20 Vol. % $SiH_4$ was introduced into the glow discharge apparatus and decomposed by glow discharge at 0.1 Torr. Subsequently, argon gas containing $C_2H_4$ and $SiH_4$ at a concentration of 18 Vol. % was introduced into the glow discharge apparatus and similarly decomposed by glow discharge at 0.1 Torr to form the second layer of about 1 μm thickness. Thereafter, for a Si single crystal substrate or a stainless steel substrate, ITO was deposited in about 1500 Å thickness on the lamination of a-$Si_{1-x}C_x$ layers having a heterojunction therebetween to form the transparent electrode, thus completing a semiconductor device having functions of photoconduction and photoelectromotive force. And, for a Si single crystal substrate or a stainless quartz glass substrate with a coating of ITO film, and AuSb alloy was deposited in about 1000 Å thickness on the lamination of the a-$Si_{1-x}C_x$ layers to form the transparent electrode, thus completing a semiconductor device having functions of photoconduction and photoelectromotive force. The composition x in the second layer was about 35% as a result of X-ray micro-analysis measurement.

The photoelectric characteristic of the thus fabricated device was measured by means of an Å light source of a tungsten lamp at an intensity of illumination of 230 Lx.

EXAMPLE 1

On a p-type Si single crystalline substrate were formed a-$Si_{1-x}C_x$ layers having a heterojunction therebetween. An ITO transparent conductive film was formed on the surface of the upper a-$Si_{1-x}C_x$ layer. Characteristics of such a device are shown in FIG. 8, where curve 35 represents dark current when the Si single crystalline substrate is biased negatively and curve 36 photoelectric current under the same condition. Curve 37 represents dark current when the substrate is biased positively and curves 38 and 39 photoelectric currents under the same condition.

While the direction of photoelectric current as represented by curve 39 is identical with that of applied voltage, the direction of photoelectric current as represented by curve 38 is opposite to that of applied voltage, showing the creation of photoelectromotive force. The photoelectromotive force of this device amounted to an open terminal voltage of about 350 mV and a short-circuited current density of about $7\times10^{-9}$ A/cm$^2$ at an intensity of illumination of 230 Lx. For photoconductive device characteristics, the ratio of photoelectric current to dark current was about $1\times10^3$ at the aforementioned intensity of illumination, and the dark current density exceeded $1\times10^{-10}$ A/cm$^2$ when the applied voltage was about 10 V and thus the average electric field was about $3\times10^4$ V/cm. It should be appreciated that with a device having an a-Si layer alone, it is impossible to obtain a dark current density of less than $1\times10^{-10}$ A/cm$^2$.

EXAMPLE 2

With a device having a stainless steel substrate provided with an ITO surface electrode, dark current and photoelectric current characteristics and photoelectromotive force characteristics when the ITO surface electrode was biased negatively were similar to those shown in FIG. 8.

EXAMPLE 3

A device having a Si single crystalline substrate and a surface electrode of about 1000 Å thick Au.Sb alloy film was fabricated. Characteristics of such a device are shown in FIG. 9, where curves 40 and 41 represent dark current and photoelectric current, respectively, when the substrate is biased negatively. Curves 42 and 43 represent dark current and photoelectric current, respectively, when the substrate is biased positively. Because of the employment of the relatively "thick" semi-transparent conductive film, the photoelectric current density is lowered as compared with that of FIG. 8. But the dark current is similar to that of FIG. 8. Presumably, because of the provision of the Au.Sb electrode and consequent reduction of the barrier between the electrode and the a-$Si_{1-x}C_x$ layer, there occurs no photoelectromotive force so that the photoelectric currents are similar with positive and negative biases applied.

Accordingly, it can be presumed that an excellent heterojunction is formed.

EXAMPLE 4

With a device having a stainless steel substrate provided with a surface electrode of about 1000 Å thick AU.Sb alloy film as in FIG. 8, similar characteristics to those in FIG. 9 were obtained.

EXAMPLE 5

To compare the device of the invention as exemplified above having the a-$Si_{1-x}C_x$ layers and the conventional device having a Se or CdS photoconductive film in mechanical strength, both the samples were scratched by the tip of a stainless steel pincette. A result was such that the conventional device with the Se or CdS film was readily damaged whereas no appreciable damage occurred to the device of the invention even when it was scratched terribly.

Photoconductive characteristics, especially, spectral sensitivity distributions of Examples 1 to 5 above are shown in FIG. 10, where curves 44 and 45 correspond to the devices provided with the Au.Sb film electrode and the ITO film electrode, respectively. Curve 46 corresponds to a relative value of a spectral sensitivity distribution of a device provided with a single film of an a-Si (about 0.7 μm thick). Curves 44 and 45 have a peak sensitivity at about 490 nm and decrease substantially analogously to curve 46 in the range of wavelengths longer than 490 nm. Since the second layer in the Examples has the composition x of 0.35 with the energy gap of about 2.3 eV as described above, the second layer alone is insensitive to the long wavelengths side. Gathering from the overall sensitivity distribution in the long wavelength side which is similar to the sensitivity distribution of the a-Si film device, it can be proven that in the Examples, charge carriers excited by photons within the first layer of a-Si film are injected into the second layer and transported thereby. The sensitivity of the Examples, on the other hand, is decreased in the range of wavelengths lower than 490 nm, presumably because the second layer having the composition x of 0.35 and provided on the side of incoming light absorbs the incoming light. The decrease of sensitivity in the short wavelength range can be avoided by increasing the composition x in the second layer so as to increase the energy gap. Incoming light may otherwise be directed onto the first layer to ensure that the incoming light can be guided to the first layer without being subject to attenuation in the second layer.

When the device of the invention is desired to be used as a photoelectromotive force device, the second layer may be a transparent thin layer as compared with the first layer and doped with impurities to exhibit a low resistance because the high withstandability against electric field is not required of the second layer. With this construction, a solution to eliminate disadvantageous light-absorption in the p-type layer inherent to the existing p.i.n homo-junction type photoelectromotive force device with the a-Si film can be provided.

In application to the field of electrophotography which is utilized for printing, the device of the invention is applied with surface charges under the application of a high voltage, and the surface charges are selectively discharged through regions which are rendered photoconductive by selective exposure to light. To this end, the devices as shown in FIGS. 6 and 7, for example, are relieved of the surface electrode 24 to promote the breakdown voltage.

The device of amorphous silicon carbide containing hydrogen and which has the heterojunction according to the invention is fabricated through a sputtering process as will be described with reference to FIGS. 11 and 12.

An amorphous heterojunction type device as shown in FIG. 11 comprises a substrate 51, an amorphous silicon layer 52 formed on the substrate 51, and an amorphous silicon carbide layer 53 formed on the layer 52. The substrate 51 includes a metal substrate, for example, of aluminum or molybdenum on which amorphous silicon is deposited by sputtering while making ohmic contact therewith, a metal substrate of platinum, for example, on which amorphous silicon is deposited by sputtering while forming a potential barrier contiguous thereto, an n-type polycrystalline silicon substrate, or an n-type single crystalline silicon substrate. The amorphous silicon layer is about 500 Å thick. The device is thus fabricated to be a heterojunction device in which amorphous materials 52 and 53 of different forbidden band widths are joined together.

With this heterojunction device, it is possible to sustain charges in the amorphous silicon carbide layer 53 for about one minute by controlling the resistivity of that layer to $10^{15}$ to $10^{16}$ Ω.cm for application to a photosensitive plate for use in electrophotography. To activate such an electrophotographing photosensitive plate in the form of the heterojunction device, light is irradiated on the amorphous silicon carbide layer 53 to charge the same. The amorphous silicon carbide layer 53 has a forbidden band width of more than about 2.4 eV so that light of short wavelengths in the visible range can reach the interface between the n-type amorphous silicon layer 52 and the amorphous silicon carbide layer 53.

By moving photo-electrons and electrons corresponding to positive hole pairs created near the interface and in the amorphous silicon layer 52 toward the amorphous silicon carbide layer 53 and positive holes toward the amorphous silicon layer 52, the charges can be sustained or erased for performing the function of a photosensitive plate.

A vacuum apparatus as schematically shown in FIG. 12 is used for fabricating the heterojunction device by sputtering amorphous silicon and amorphous silicon carbide. In the figure, there are illustrated electrodes 56 and 58, a substrate 55 on which the material is deposited, a substrate 57 which is to be sputtered, and a valve 59 for feeding a desired mixture gas to the interior of a bell jar 54. In order to form the amorphous silicon layer and the amorphous silicon carbide layer by sputtering, the interior of the bell jar 54 is first evacuated to less than 1 to $5 \times 10^{-6}$ Torr and the mixture gas is then introduced into the bell jar via the valve 59 to mitigate the evacuated pressure to $5 \times 10^{-3}$ to $1 \times 10^{-1}$ Torr, the mixture gas containing an inert gas such as argon, hydrogen, a gas of hydrocarbon system such as methane and, in a case of addition of impurities, an additional gas such as phosphine ($PH_3$) or diborane ($B_2H_6$). Thereafter, DC voltage or one to ten and several MHz high frequency voltage is applied across the electrodes 56 and 58 to place the interior of the bell jar 54 into plasma condition. Used in this process are about 1 to 3 KV applied voltage, 100 to 300 mA current, and 50 to 500 W power consumption. Under these conditions, the vapor deposition rate can be controlled to 0.2 to 2 Å/sec to sputter silicon in the substrate 57 for formation of amorphous semiconductor on the substrate 55.

Turning to FIG. 13, an embodiment will be described in which the heterojunction device is used as a photoelectromotive force device. In this embodiment, an n-type amorphous silicon layer 65 of about 500 Å thickness is formed on a substrate 66 of, for example, aluminum, making ohmic contact therewith. Then, an intrinsic amorphous silicon layer 64 of about 1 μm thickness is formed on the layer 65 with successive formation of a p-type amorphous silicon or p-type amorphous silicon carbide layer 63 of about 500 Å thickness, thereby completing a heterojunction type photoelectromotive force device. Upon irradiation of light upon the p-type amorphous silicon layer 63, photo-electrons and positive hole pairs are created in the intrinsic amorphous silicon layer 64, whereby the electrons are moved toward the n-type amorphous silicon layer 65 and the positive holes toward the p-type amorphous silicon layer or p-type amorphous silicon carbide layer 63 to thereby obtain photoelectromotive force. Amorphous silicon carbide having a larger forbidden band width than that of amorphous silicon is advantageously used to obtain a large open terminal voltage. For the sake of effectively picking up the thus generated photoelectromotive force, the device is provided with a comb-like electrode 61 formed on the p-type amorphous silicon carbide and a reflection inhibiting film 62 of, for example, zirconium oxide.

A similar heterojunction photoelectromotive force device may be fabricated by forming on a substrate an n-type amorphous silicon layer, a p-type amorphous silicon layer, an amorphous silicon carbide layer, and an n-type $In_2O_3$ or $SnO_2$ layer which is transparent to the majority of incoming light.

The heterojunction device as described above can be formed into a thin film. Accordingly, when a highly flexible and thermally resistive thin resin film such as of polyimido is used as the substrate, such a photoelectric conversion device as a photoelectromotive force device or a photo-sensitive plate for use in electrophotography can have an extended field of application because it is highly yielding.

As described above, in the heterojunction device wherein amorphous silicon and amorphous silicon carbide having different forbidden band widths are sputtered to form semiconductor thin films, the forbidden band width can be controlled by simply varying compositions of silicon and carbon in silicon carbide, giving rise to a number of advantages of the heterojunction type photoelectric conversion device.

More particularly, since in accordance with the invention the silicon substrate is sputtered to vapor deposit sputtered silicon onto the substrate subject to deposition, and the gas of hydrocarbon system is concurrently introduced for vapor deposition of silicon carbide onto the substrate subject to deposition, the formation of silicon and silicon carbide films on the substrate subject to deposition can be effected through one continuous deposition step, and the composition can easily be varied by simply varying partial pressure of the hydrocarbon system gas.

Figure 14:
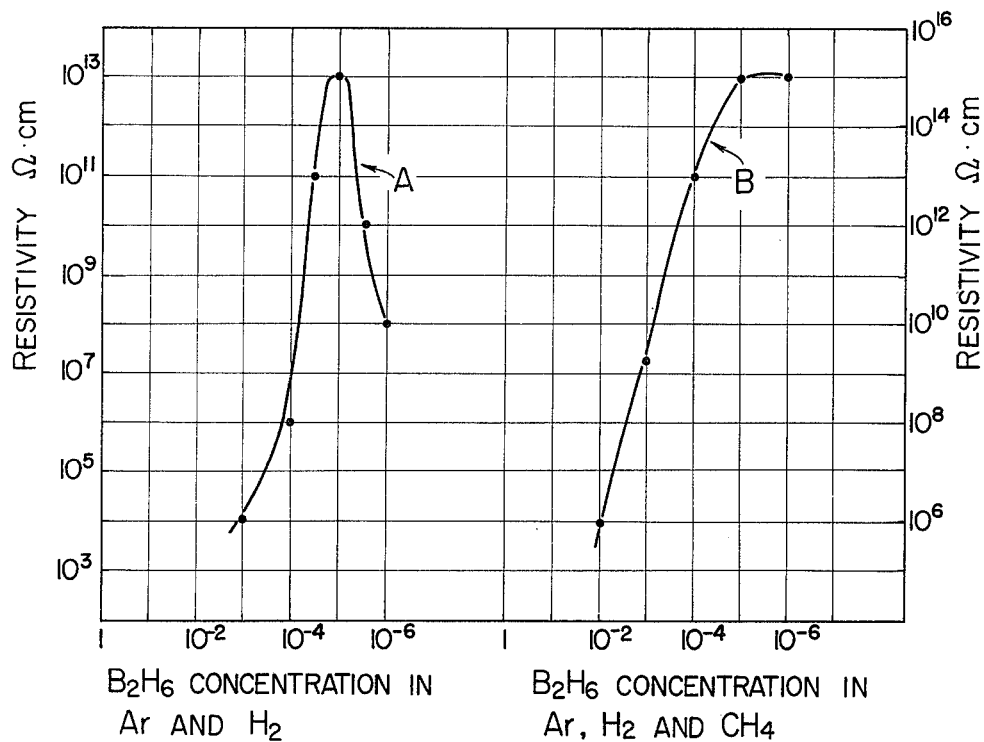
FIG. 14 is a graph to show a relation between impurity concentration and resistivity in one example of heterojunction device according to the present invention.

The possibility of controlling the resistivity by addition of boron into the thin film during the formation thereof is evidenced by experimental data as shown in FIG. 14 where the abscissa represents concentration of diborane admixed in the mixture gas of argon, hydrogen and methane upon sputtering, and the ordinate represents values of resistivity, and where curve A corresponds to an amorphous silicon layer and curve B to an amorphous silicon carbide layer.

Figure 15:
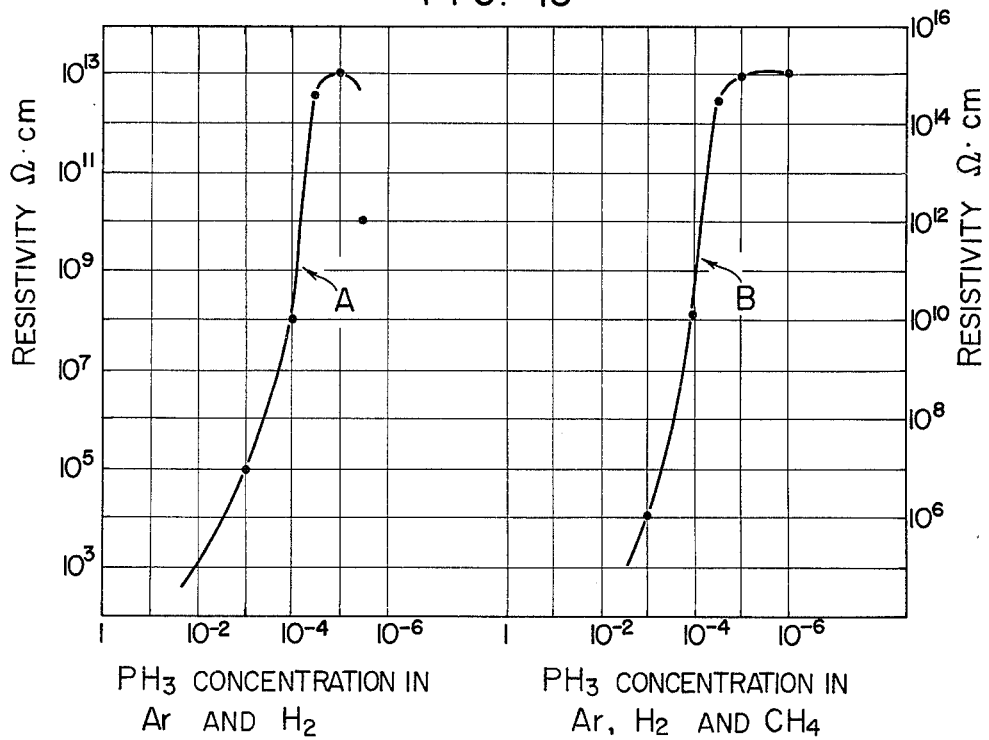
FIG. 15. is a similar graph in another example of heterojunction device according to the present invention.

Similar experimental data are shown in FIG. 15 which are obtained when an n-type amorphous silicon layer and an n-type amorphous silicon carbide layer are prepared by adding phosphine.

In the $a-Si_{1-x}C_x$ layers for forming the heterojunction according to the invention, x=0.1 may be included.

As has been described, the invention provides a semiconductor device utilizing continuously controllable composition x in the $a-Si_{1-x}C_x$ layers having the heterojunction therebetween, wherein the first layer having a relatively small x shares the function of creating carriers by photon excitation and the second layer having a relatively large x shares the function of light transparency and withstandability against electric field as well as ability to transport the photon excited carriers, so that full use can be made of characteristic properties of the respective layers. Therefore, the invention is advantageous and industrially valuable in that:

(1) It is possible to provide a highly sensitive photoconductive device whose light wavelength sensitivity range is desirably adjustable to cover visible and ultraviolet ranges by adjusting the composition of $a-Si_{1-x}C_x$ layers;

(2) It is possible to provide the highly sensitive photoconductive device which has high breakdown electric field or voltage and minimal dark current;

(3) The provision of a photoconductive device of high mechanical strength can be ensured, which is advantageously applied, in particular, to electrophotographing apparatus requiring high durability against abrasion;

(4) The conductivity of the $a-Si_{1-x}C_x$ layers can easily be controlled by doping impurities so that the resulting heterojunction can mitigate the attenuation of incoming light in the p-type layer which is an inherent disadvantage of the p.i.n homojunction type a-Si photoelectromotive force device;

(5) The photoconductive layer can be deposited at low temperatures, dispensing with the need for heat treatment after the deposition and can be made of the amorphous material; freedom of selection of material and shape for the substrate is provided, simplifying the fabrication of the device and extending variation in shape of the device in compliance with the intended purposes; and (6) The fundamental material is not poisonous and polluted.

We claim:

1. A semiconductor device comprising: a substrate, first and second amorphous $Si_{1-x}C_x$ ($0 \leq X < 1$) films including hydrogen formed on one surface of said substrate, said first and second amorphous $Si_{1-x}C_x$ films having different x values, respectively, and a pair of transparent electrodes provided to contact said first and second amorphous $Si_{1-x}C_x$ films respectively.

2. A semiconductor device as claimed in claim 1, wherein said substrate is transparent.

3. A semiconductor device as claimed in claim 2, wherein one of said pair of electrodes is disposed between the transparent substrate and one of said first and second amorphous films and the other one of said pair of electrodes is disposed on the other one of said first and second amorphous films.

4. A semiconductor device as claimed in claim 3, wherein at least one of said first and second amorphous films is at least partly doped with an impurity of one of p-type and n-type.

* * * * *